United States Patent
Yamashita

(10) Patent No.: US 10,153,320 B2
(45) Date of Patent: Dec. 11, 2018

(54) SEMICONDUCTOR DEVICE AND METHOD OF FORMING THE SAME

(71) Applicant: TAIWAN SEMICONDUCTOR MANUFACTURING COMPANY LTD., Hsinchu (TW)

(72) Inventor: Yuichiro Yamashita, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/402,690

(22) Filed: Jan. 10, 2017

(65) Prior Publication Data

US 2018/0151619 A1    May 31, 2018

Related U.S. Application Data

(60) Provisional application No. 62/427,719, filed on Nov. 29, 2016.

(51) Int. Cl.
*H01L 31/062*    (2012.01)
*H01L 31/113*    (2006.01)
*H01L 27/146*    (2006.01)

(52) U.S. Cl.
CPC .... *H01L 27/14649* (2013.01); *H01L 27/1469* (2013.01); *H01L 27/14627* (2013.01); *H01L 27/14634* (2013.01); *H01L 27/14636* (2013.01); *H01L 27/14685* (2013.01); *H01L 27/14689* (2013.01)

(58) Field of Classification Search
USPC ............................ 257/13, 79–103, 191, 918, 257/E51.018–E51.022, E33.01–E33.077, 257/E33.054, E25.028, E25.032, E31.058, 257/E31.063, E31.115, E25.03, 257/E27.133–E27.139, 252–254; 438/22–47, 69, 493, 503, 507, 956

See application file for complete search history.

(56) References Cited

U.S. PATENT DOCUMENTS

| | | | |
|---|---|---|---|
| 7,564,115 B2 | 7/2009 | Chen et al. | |
| 7,633,165 B2 | 12/2009 | Hsu et al. | |
| 7,825,024 B2 | 11/2010 | Lin et al. | |
| 7,888,763 B2 * | 2/2011 | Qian | H01L 27/14603 257/447 |
| 7,973,413 B2 | 7/2011 | Kuo et al. | |
| 8,105,875 B1 | 1/2012 | Hu et al. | |
| 8,158,456 B2 | 4/2012 | Chen et al. | |
| 8,183,578 B2 | 5/2012 | Wang | |
| 8,183,579 B2 | 5/2012 | Wang | |
| 8,227,902 B2 | 7/2012 | Kuo | |
| 8,278,152 B2 | 10/2012 | Liu et al. | |

(Continued)

*Primary Examiner* — Tram H Nguyen
(74) *Attorney, Agent, or Firm* — WPAT, P.C., Intellectual Property Attorneys; Anthony King

(57) ABSTRACT

A semiconductor device includes: a visible light sensing layer, having a first surface and a second surface opposite to the first surface; an infrared ray sensing layer, having a first surface and a second surface opposite to the first surface, and the first surface of the visible light sensing layer attached to the second surface of the infrared ray sensing layer; and a circuitry layer, having a first surface and a second surface opposite to the first surface, and the first surface of the infrared ray sensing layer attached to the second surface of the circuitry layer.

20 Claims, 14 Drawing Sheets

(56) References Cited

U.S. PATENT DOCUMENTS

| | | |
|---|---|---|
| 8,426,961 B2 | 4/2013 | Shih et al. |
| 8,669,174 B2 | 3/2014 | Wu et al. |
| 8,802,504 B1 | 8/2014 | Hou et al. |
| 8,803,292 B2 | 8/2014 | Chen et al. |
| 8,803,316 B2 | 8/2014 | Lin et al. |
| 9,818,784 B2* | 11/2017 | Baba ................. H01L 27/14634 |
| 9,854,184 B2* | 12/2017 | Velichko ........... H01L 27/14629 |
| 2014/0001645 A1 | 1/2014 | Lin et al. |
| 2014/0225258 A1 | 8/2014 | Chiu et al. |
| 2014/0252572 A1 | 9/2014 | Hou et al. |
| 2015/0287697 A1 | 10/2015 | Tsai et al. |
| 2015/0295007 A1* | 10/2015 | Cellek ............... H01L 27/14645 257/84 |
| 2015/0348872 A1 | 12/2015 | Kuo et al. |
| 2017/0278826 A1* | 9/2017 | Sugizaki .................. G02B 5/20 |
| 2018/0039070 A1* | 2/2018 | Mao .................... G02B 26/005 |

* cited by examiner

SEMICONDUCTOR DEVICE AND METHOD OF FORMING THE SAME

CROSS-REFERENCE TO RELATED APPLICATION

This application claims the benefit of U.S. Provisional Application No. 62/427,719, filed Nov. 29, 2016.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density has generally increased while geometry size has decreased. This scaling down process generally provides benefits by increasing production efficiency and lowering associated costs. As one application, imaging sensors capable of simultaneously capturing images of different bands are incorporated in an integrated circuit. However, the performance of detecting the different bands of light in an integrated circuit may not be desirable because some bands of light may be resisted from inputting to the sensing circuit of the integrated circuit. For example, the top layer of the integrated circuit may block some bands of light from inputting to the sensing circuit beneath the top layer. Therefore, there is a need to provide a novel image sensor to detect the different bands of light.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
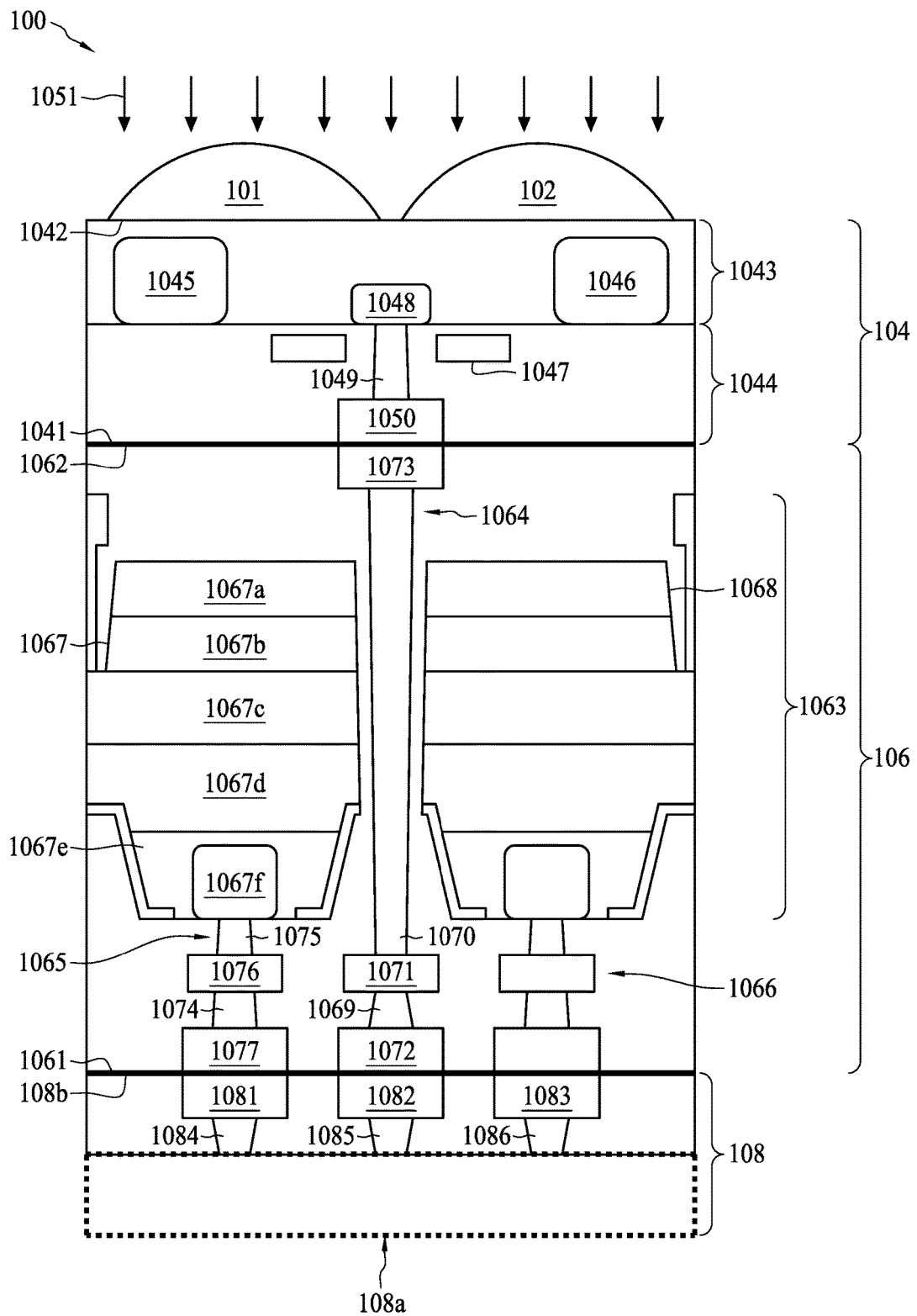
FIG. 1 is a diagram illustrating a semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIG. 1 is a diagram illustrating a semiconductor device 100 in accordance with some embodiments. The semiconductor device 100 includes an image sensor in a stacked structure. For example, the semiconductor device 100 may be a multi-layer and multi-band image sensor. According to some embodiments, the semiconductor device 100 comprises lens 101, 102, a first light sensing layer 104, a second light sensing layer 106, a circuitry layer 108. The first light sensing layer 104 comprises a plurality of pixels for converting visible light into electrical signal. The second light sensing layer 106 comprises a plurality of pixels for converting infrared ray into electrical signal. For brevity, FIG.

1 merely shows two pixels of the first light sensing layer 104 and two pixels of the second light sensing layer 106.

The first light sensing layer 104 and the circuitry layer 108 is the top layer and the bottom layer of the semiconductor device 100, respectively. The first light sensing layer 104 has a first surface 1041 and a second surface 1042 opposite to the first surface 1041. The second light sensing layer 106 has a first surface 1061 and a second surface 1062 opposite to the first surface 1061. The circuitry layer 108 has a first surface 108a and a second surface 108b opposite to the first surface 108a. The lenses 101, 102 are disposed on the second surface 1042 of the first light sensing layer 104. The first surface 1041 of the first light sensing layer 104 is attached to the second surface 1062 of the second light sensing layer 106. The first surface 1061 of the second light sensing layer 106 is attached to the second surface 108b of the circuitry layer 108. According to some embodiments, the first light sensing layer 104 is a visible light sensing layer, and the second light sensing layer 106 is an infrared ray sensing layer. However, this is not a limitation of the present embodiments. The first light sensing layer 104 may be arranged to sense a first band of light other than the visible light, and the second light sensing layer 106 may be arranged to sense a second band of light other than the infrared ray. In addition, the infrared ray may include the near-infrared (NIR) ray.

According to some embodiments, the first light sensing layer 104 comprises a photodiode layer 1043 and a semiconductor layer 1044. The photodiode layer 1043 is configured to have a first photodiode 1045 and a second photodiode 1046. A field-effect transistor 1047 is formed in the semiconductor layer 1044. An interconnect structure (not numbered) is arranged to electrically connect a diffusion area (e.g. N+) 1048 of the field-effect transistor 1047. The interconnect structure comprises a via 1049 and a pad 1050. The pad 1050 is formed on the first surface 1041 of the first light sensing layer 104. The via 1049 is vertically disposed between the diffusion area 1048 and the pad 1050. According to some embodiments, the first photodiode 1045 and the second photodiode 1046 are disposed under the lenses 101, 102, respectively. The field-effect transistor 1047 is disposed under a region between the lenses 101, 102. The field-effect transistor 1047 is configured to serve as a source follower. The field-effect transistor 1047 is electrically connected to the first photodiode 1045 or the second photodiode 1046. For brevity, the field-effect transistor 1047 is electrically connected to the first photodiode 1045. The first photodiode 1045 and the second photodiode 1046 are arranged to generate a first electrical signal and a second electrical signal, respectively, in response to visible light in the incident light 1051. The field-effect transistor 1047, configured as a source follower, generates an output signal and sends the same through the via 1049. The lenses 101, 102 are used to focus the incident light on the first photodiode 1045 and the second photodiode 1046, respectively.

The second light sensing layer 106 comprises a photodiode layer 1063, a first interconnect structure 1064, a second interconnect structure 1065, and a third interconnect structure 1066. The photodiode layer 1063 is configured to have a first photodiode 1067 and a second photodiode 1068. The second interconnect structure 1065 and the third interconnect structure 1066 are electrically connected to the first photodiode 1067 and the second photodiode 1068, respectively. The first interconnect structure 1064 is arranged to vertically dispose the second light sensing layer 106. The first interconnect structure 1064 may comprise a plurality of vias and a plurality of metal lines. For brevity, the first interconnect structure 1064 comprises a first via 1069, a second via 1070, a metal line 1071, a first pad 1072, and a second pad 1073. The first pad 1072 and the second pad 1073 are disposed on the first surface 1061 and the second surface 1062, respectively. The first via 1069, the second via 1070, and the metal line 1071 are electrically connected between the first pad 1072 and the second pad 1073. According to some embodiments, the first via 1069 may be a through-substrate-via (TSV). The second pad 1073 is electrically connected to the pad 1050. The first interconnect structure 1064 is vertically aligned with the via 1049 of the first light sensing layer 104.

The second interconnect structure 1065 comprises a plurality of vias and a plurality of metal lines. For brevity, the second interconnect structure 1065 comprises a first via 1074, a second via 1075, a metal line 1076, and a pad 1077. The pad 1077 is disposed on the first surface 1061. The first via 1074, the second via 1075, and the metal line 1076 are electrically connected between the first photodiode 1067 and the pad 1077. The first photodiode 1067 is arranged to generate an electrical signal in response to the infrared ray in the incident light 1051. The second interconnect structure 1065 is arranged to transmit the electrical signal to the circuitry layer 108.

The photodiode layer 1063 may be configured as a germanium (Ge) short wavelength infrared (SWIR) imager or indium gallium arsenide (InGaAs) SWIR imager. The first photodiode 1067 comprises a plurality of stacked functional layers 1067a, 1067b, 1067c, 1067d, and 1067e. The first functional layer 1067a is a phosphorus-doped silicon layer. The second functional layer 1067b is a buffer layer. The third functional layer 1067c is an N+ implanted indium phosphide (InP) layer. The fourth functional layer 1067d is an InGaAs layer. The fifth functional layer 1067e is a P− implanted group III-V layer. The fifth functional layer 1067e further comprises a P+ implanted group III-V layer 1067f inside the P− implanted group III-V layer. According to some embodiments, the second via 1075 is connected to the P+ implanted group III-V layer 1067f.

Moreover, the second photodiode 1068 and the third interconnect structure 1066 are similar to the first photodiode 1067 and the second interconnect structure 1065, respectively. Thus, the detailed description is omitted for brevity.

In the circuitry layer 108, the circuitry layer 108 is configured to be a control circuit to control the operations of the first light sensing layer 104 and the second light sensing layer 106 and to receive the electrical signals from the first light sensing layer 104 and the second light sensing layer 106. For brevity, the circuitry layer 108 merely shows a first pad 1081, a second pad 1082, a third pad 1083, a first via 1084, a second via 1085, and a third via 1086. The first pad 1081, the second pad 1082, and the third pad 1083 are disposed on the second surface 1082. The first via 1084, the second via 1085, and the third via 1086 are connected to the first pad 1081, the second pad 1082, and the third pad 1083, respectively. In addition, the first pad 1081, the second pad 1082, and the third pad 1083 are in contact with the pad 1077, the pad 1072, and the pad of the third interconnect structure 1066, respectively.

According to some embodiments, the first light sensing layer 104, the second light sensing layer 106, and the circuitry layer 108 are formed by Hybrid Bonding Technology. The Hybrid Bonding Technology is a wafer-to-wafer bonding process for bonding two or three functional (e.g.

ASIC) wafers containing through silicon vias (TSVs). The bonded two or three wafers is then diced to form a plurality of image sensors.

In the semiconductor device 100, the visible light in the incident light 1051 is detected by the photodiodes (e.g. 1045) in the first light sensing layer 104, and the infrared ray in the incident light 1051 is detected by the photodiodes (e.g. 1067) in the second light sensing layer 106. There is only one field-effect transistor formed beside a photodiode in the first light sensing layer 104. Therefore, the infrared ray in the incident light 1051 may pass through the first light sensing layer 104 to reach the second light sensing layer 106. In other words, when the first light sensing layer 104 and the second light sensing layer 106 are placed on the top two layer of the semiconductor device 100, and the circuitry layer 108 is placed on the bottom layer of the semiconductor device 100, the infrared ray in the incident light 1051 is not blocked by the circuitry layer 108 before entering the second light sensing layer 106. In this embodiment, the electrical signal generated by the photodiode 1045 in the first light sensing layer 104 is transmitted to the circuitry layer 108 by the interconnect structure (i.e. 1049 and 1050) and the first interconnect structure 1064, and the electrical signal generated by the photodiode 1067 in the second light sensing layer 106 is transmitted to the circuitry layer 108 by the second interconnect structure 1066. The interconnect structure (i.e. 1049 and 1050) and the first interconnect structure 1064 are vertically disposed under the region between the lenses 101, 102. Therefore, the interconnect structure (i.e. 1049 and 1050) and the first interconnect structure 1064 may not affect or block the infrared ray in the incident light 1051 from entering the second light sensing layer 106. Accordingly, the semiconductor device 100 has better performance of converting the infrared ray and visible light into electrical signals in comparison to existing methods.

Figure 2:
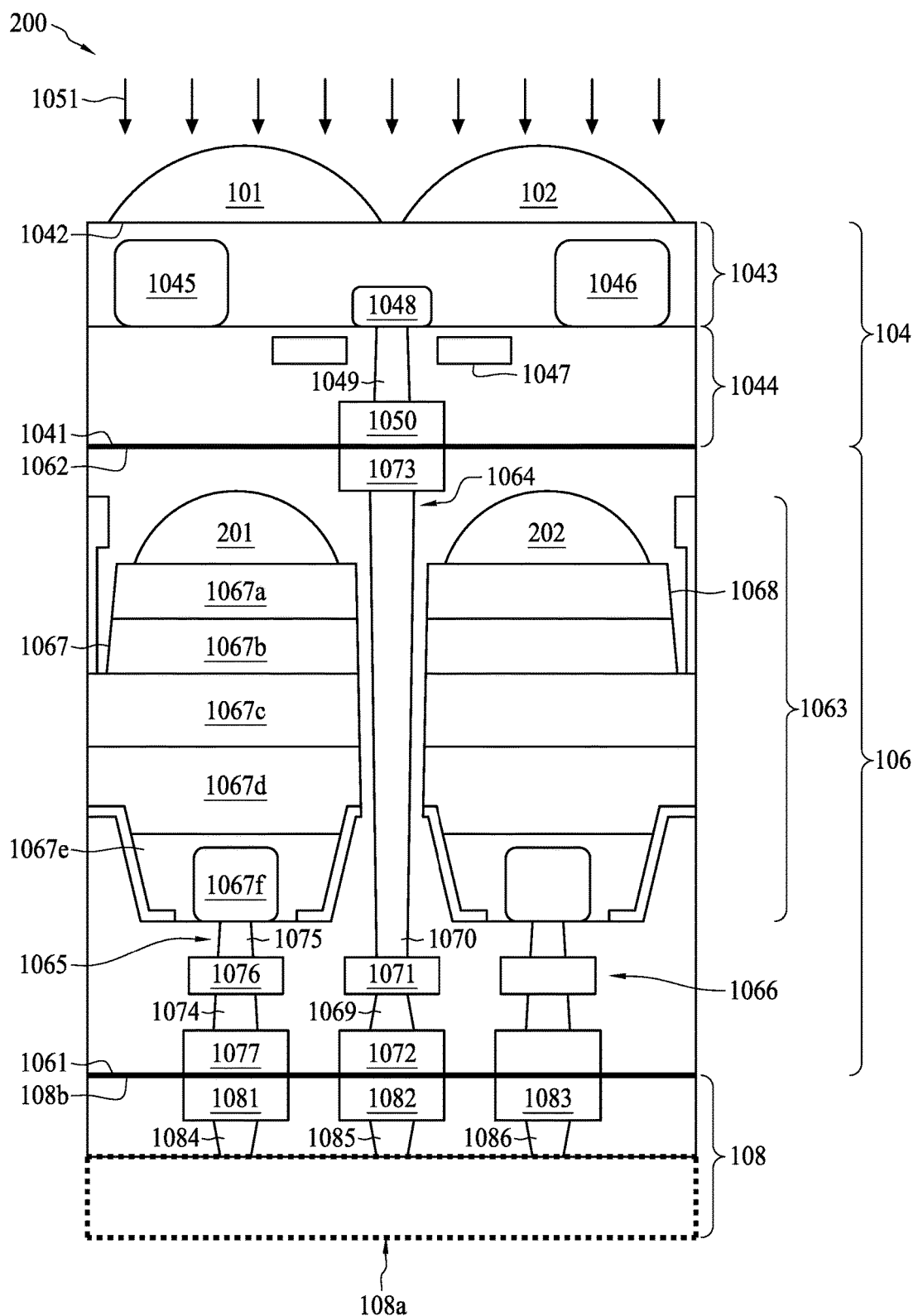
FIG. 2 is a diagram illustrating a semiconductor device in accordance with some embodiments.

FIG. 2 is a diagram illustrating a semiconductor device 200 in accordance with some embodiments. The semiconductor device 200 is a stacked semiconductor device. In comparison to the semiconductor device 100, the semiconductor device 200 further comprises a first lens 201 and a second lens 202 disposed on the first photodiode 1067 and the second photodiode 1068, respectively. For brevity, the numerals of the elements are similar to those in the semiconductor device 100. In the semiconductor device 200, the first lens 201 and the second lens 202 are disposed on the top of the second light sensing layer 106. For example, the first lens 201 and the second lens 202 are disposed on the phosphorus-doped silicon layer (i.e. 1067a) of the first photodiode 1067 and the phosphorus-doped silicon layer (not numbered) of the second photodiode 1068, respectively, as shown in FIG. 2. The first lens 201 and the second lens 202 are used to focus the incident light 1051 on the first photodiode 1067 and the second photodiode 1068, respectively. Accordingly, the performance of the conversion of the infrared ray into the electrical signal of the second light sensing layer 106 is further improved. According to some embodiments, the material of the first lens 201 and the second lens 202 may be composed of silicon nitride (SiN), Polysilicon, or Silicon.

Figure 3:
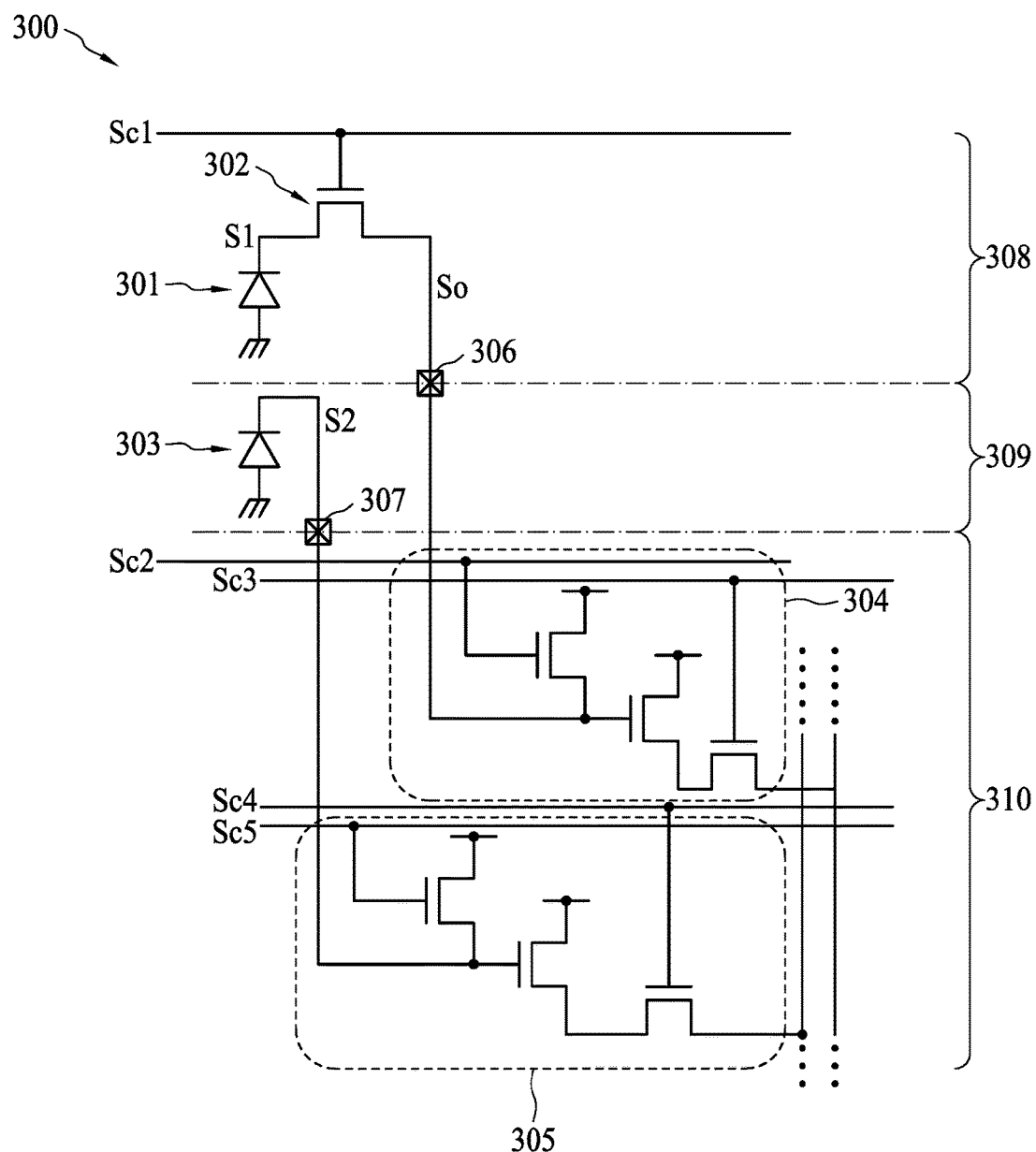
FIG. 3 is a diagram illustrating an image sensing circuit in accordance with some embodiments.

FIG. 3 is a diagram illustrating an image sensing circuit 300 in accordance with some embodiments. The image sensing circuit 300 may be an equivalent circuit of the semiconductor devices 100 or 200. The image sensing circuit 300 comprises a first photodiode 301, a field-effect transistor 302, a second photodiode 303, a first control circuit 304, and a second control circuit 305. A first pad 306 is disposed on an interface between the top layer 308 and the second layer 309. A second pad 307 is disposed on an interface between the second layer 309 and the bottom layer 310. The first photodiode 301 and the field-effect transistor 302 are disposed in the top layer 308 of the image sensing circuit 300. The second photodiode 303 is disposed in the second layer 309 right under the top layer 308 of the image sensing circuit 300. The first control circuit 304 and the second control circuit 305 are disposed in the bottom layer 310 of the image sensing circuit 300. The first control circuit 304 is arranged to receive an output signal So corresponding to a first electrical signal S1 generated by the first photodiode 301. The first photodiode 301 generates the first electrical signal S1 in response to the visible light of the incident light. The second control circuit 305 is arranged to receive a second electrical signal S2 generated by the second photodiode 303. The second photodiode 303 generates the second electrical signal S2 in response to the infrared ray of the incident light. The field-effect transistor 302 is controlled by a first control signal Sc1. The first control circuit 304 is controlled by a second control signal Sc2 and a third control signal Sc3. The second control circuit 305 is controlled by a fourth control signal Sc4 and a fifth control signal Sc5. The detailed circuits and the operation of the first control circuit 304 and the second control circuit 305 are omitted here for brevity. According to the image sensing circuit 300, as compared to existing circuits, a less amount of wires is required on the top layer 308. In other words, the top layer 308 allows more space for incident light to pass through the top layer 308.

Figure 4:
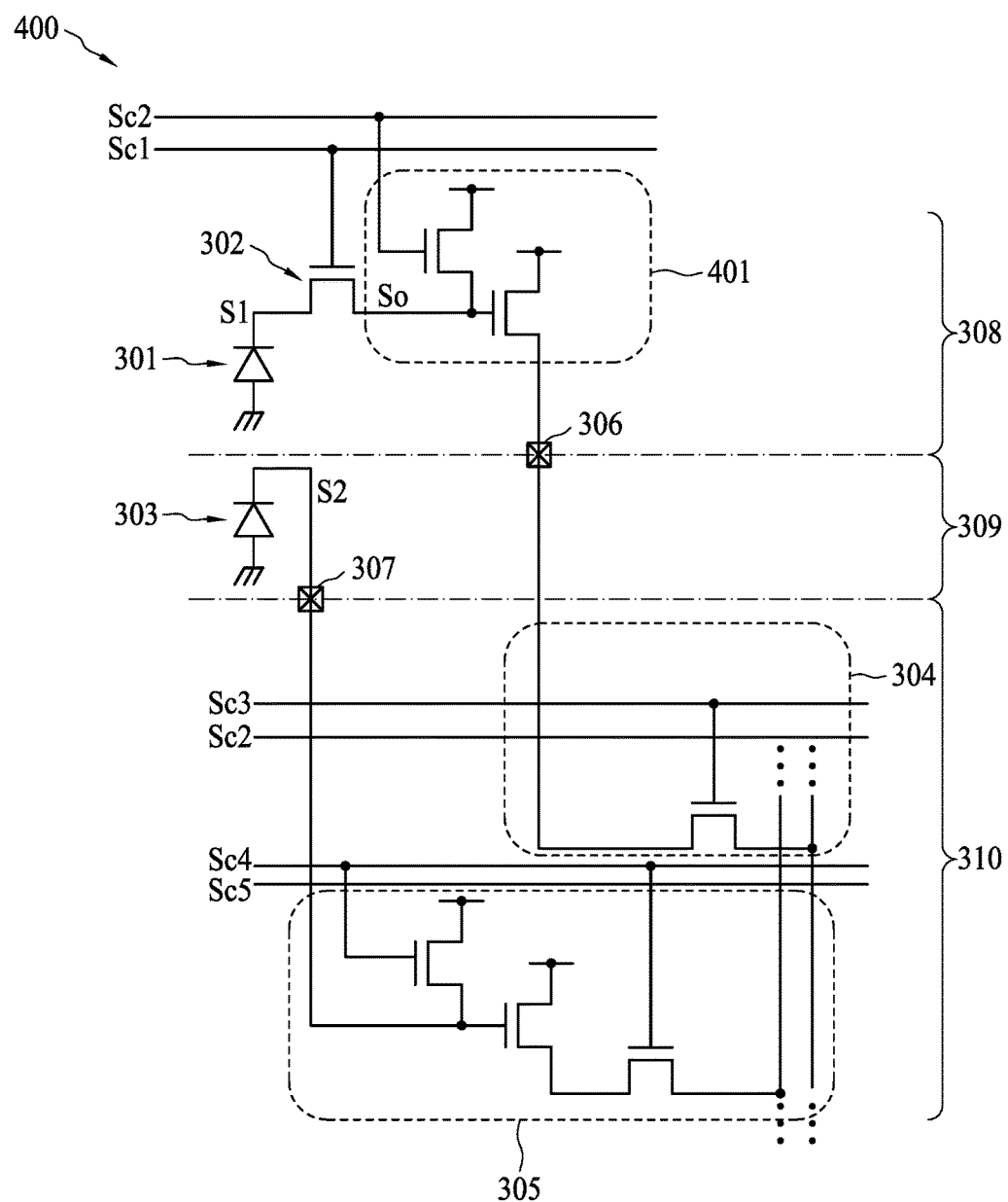
FIG. 4 is a diagram illustrating an image sensing circuit in accordance with some embodiments.

In the image sensing circuit 300, only one field-effect transistor (i.e. 302) is disposed in the top layer 308 and most of the control elements are disposed in the bottom layer 310, which may affect the conversion gain of the first photodiode 301. To increase the conversion gain of the first photodiode 301, some of the control elements in the first control circuit 304 may be removed to the top layer 308. FIG. 4 is a diagram illustrating an image sensing circuit 400 in accordance with some embodiments. In comparison to the image sensing circuit 300, the top layer of the image sensing circuit 400 comprises more field-effect transistors. For brevity, the numerals of the elements are similar to those in the image sensing circuit 300. In the image sensing circuit 400, a portion circuit 401 of the first control circuit 304 in the bottom layer 310 is removed to the top layer 308. Accordingly, there has more wires on the top layer 308, thus the top layer 308 has less space for the incident light to pass through the top layer 308. However, for the image sensing circuit 400, the first photodiode 301 has a higher conversion gain of the visible light in comparison to the image sensing circuit 300. Therefore, the image sensing circuit 400 has lower noise in comparison to the image sensing circuit 300.

Figure 5:
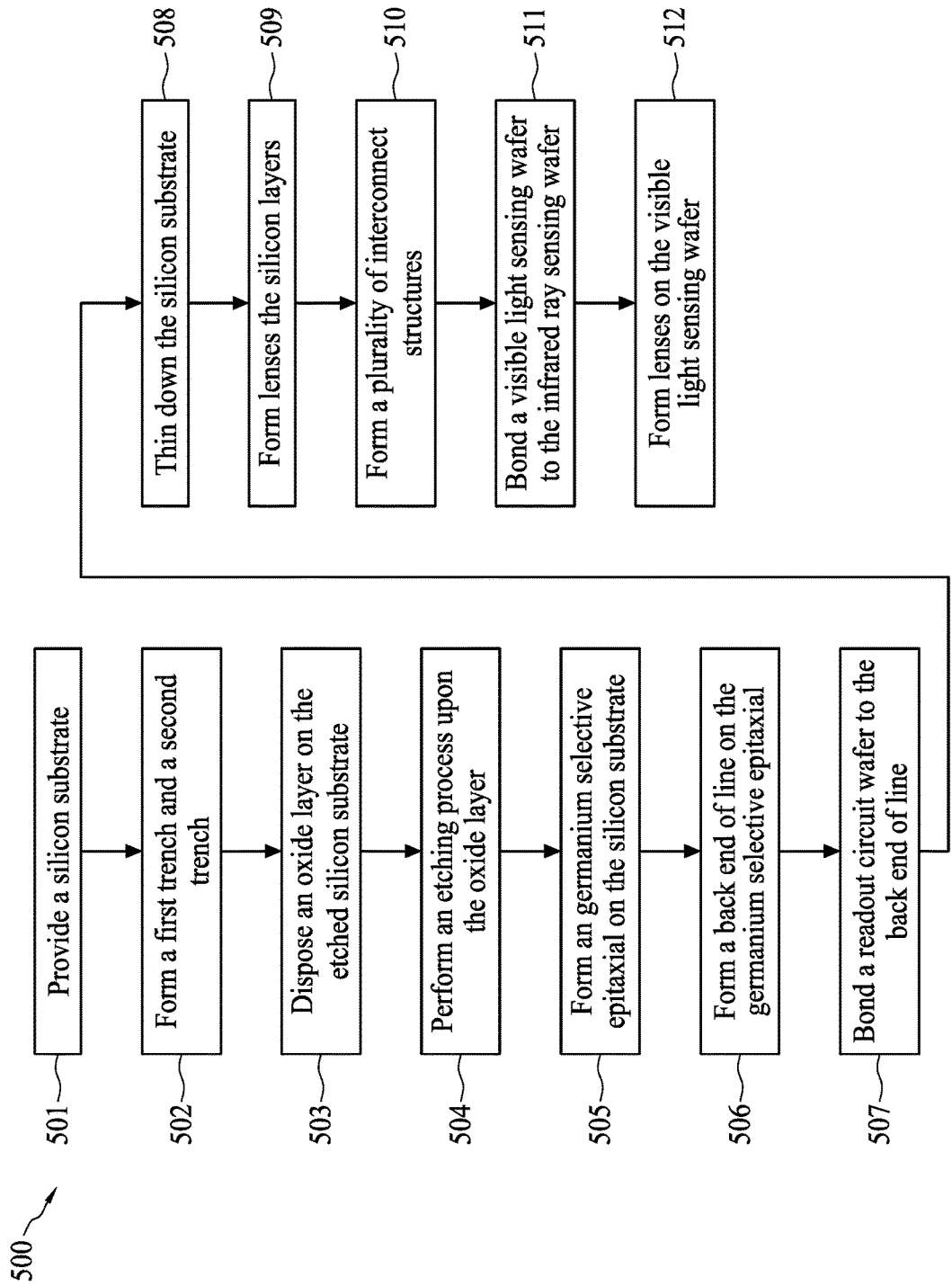
FIG. 5 is a flow diagram illustrating a method of fabricating a semiconductor device in accordance with some embodiments.

FIG. 5 is a flow diagram illustrating a method 500 of fabricating the semiconductor device 200 in accordance with some embodiments. The method 500 includes several operations, which are discussed in detail with reference to FIGS. 6 to 17. The method 500 is a wafer-level operation for fabricating a wafer-level semiconductor device. However, for brevity, FIGS. 6 to 17 merely show a portion of the cross-sectional view of the device during the fabrication. In operation 501, a silicon substrate is provided. In operation 502, the silicon substrate is etched to form a first trench and a second trench. In operation 503, an oxide layer is disposed on the etched silicon substrate. In operation 504, an etching process is performed upon the oxide layer to form a first oxide portion and a second oxide portion on the first trench and the second trench respectively. In operation 505, an germanium selective epitaxial is formed on the silicon substrate. In operation 506, the back end of line (BEOL) is formed on the germanium selective epitaxial. In operation 507, a readout circuit wafer is bonded to the back end of line. In operation 508, the silicon substrate is thinned down to expose the first oxide portion and the second oxide portion. In operation 509, a plurality of lenses are formed on the silicon layers on the germanium selective epitaxials respectively. In operation 510, a plurality of interconnect structures are formed on the interconnect structures that are not contacted to the germanium selective epitaxials respectively. In operation 511, a visible light sensing wafer is bonded to the infrared ray sensing wafer. In operation 512, a plurality of lenses are formed on the visible light sensing wafer.

FIGS. 6 to 17 have been simplified for a better understanding of the inventive concepts of the present disclosure.

Figure 6:
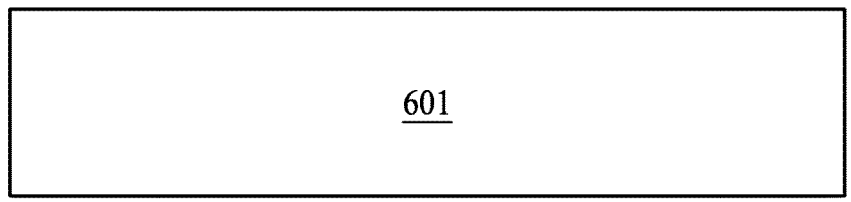
FIGS. 6 to 17 are cross-sectional views corresponding to various operations in FIG. 5.

Referring to FIG. 6, in operation 501, a silicon substrate 601 is provided. The silicon substrate 601 may also be replaced with a germanium (Ge) substrate or an organic material substrate.

Figure 7:
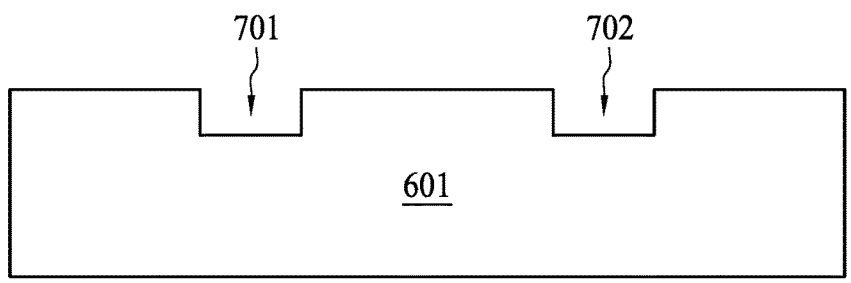

Referring to FIG. 7, in operation 502, the silicon substrate 601 is etched to form a first trench 701 and a second trench 702. The first trench 701 and the second trench 702 correspond to the positions of the TSVs of the infrared light sensing layer.

Figure 8:
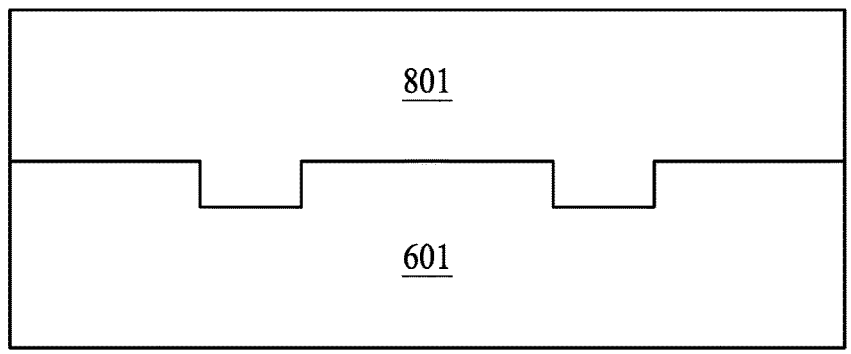

Referring to FIG. 8, in operation 503, an oxide layer 801 is disposed on the etched silicon substrate 601. The oxide layer 801 may be formed by deposition and/or chemical mechanical polishing process.

Figure 9:
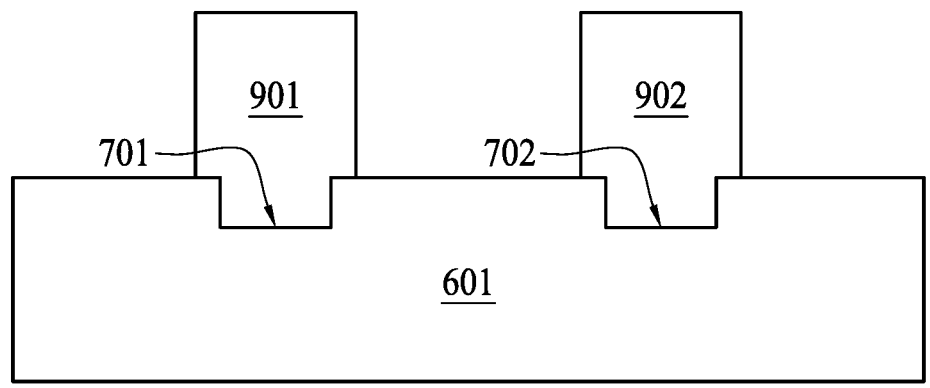

Referring to FIG. 9, in operation 504, an etching process is performed upon the oxide layer to form a first oxide portion 901 and a second oxide portion 902 on the first trench 701 and the second trench 702 respectively.

Figure 10:
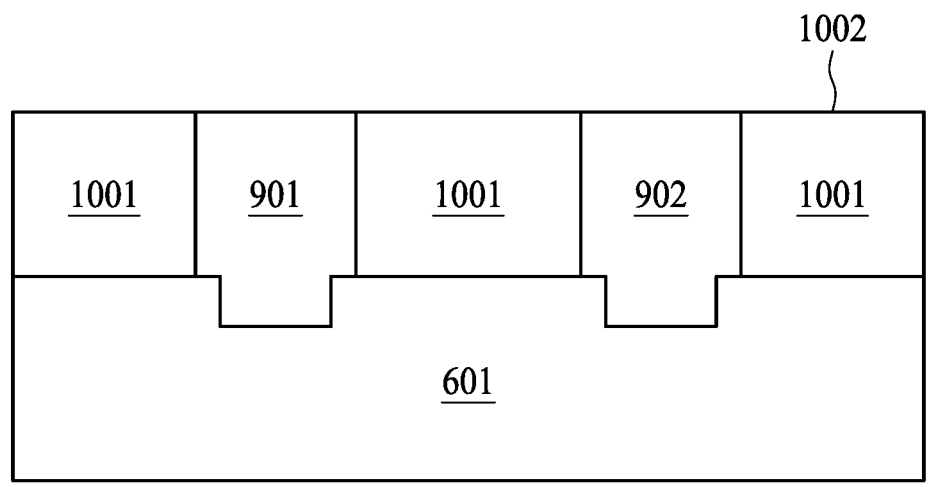

Referring to FIG. 10, in operation 505, an germanium selective epitaxial 1001 is formed on the silicon substrate 601. The germanium selective epitaxial 1001 is arranged to surround the first oxide portion 901 and the second oxide portion 902. The germanium selective epitaxial 1001, the first oxide portion 901, and the second oxide portion 902 are planarized to have a top surface 1002. According to some embodiments, the germanium selective epitaxial 1001 is arranged to form (SWIR) imagers. Therefore, the germanium selective epitaxial 1001 may comprise a plurality of functional layers similar to the above mentioned functional layers 1067a, 1067b, 1067c, 1067d, and 1067e. The detailed description is omitted here for brevity.

Figure 11:
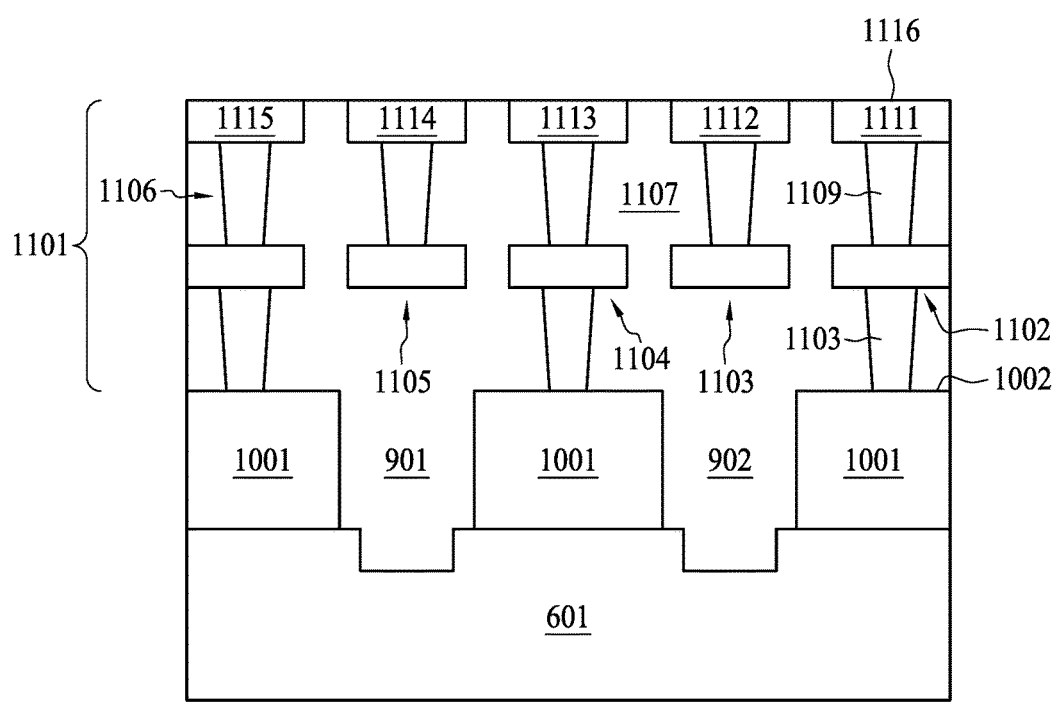

Referring to FIG. 11, in operation 506, a back end of line (BEOL) 1101 is formed on the top surface 1002. The back end of line 1101 comprises a plurality of interconnect structures 1102, 1103, 1104, 1105, 1106. Some of the interconnect structures 1102, 1104, 1106 are contacted with the germanium selective epitaxial 1001, and some of the interconnect structures 1103, 1105 are not contacted with the germanium selective epitaxial. The interconnect structures 1103, 1105 are disposed on the first oxide portion 901 and the second oxide portion 902. The interconnect structures 1102, 1103, 1104, 1105, 1106 are surrounded by oxide layer 1107. Each interconnect structure may comprises a plurality of vias (e.g. 1108 and 1109), a metal line (e.g. 1110), and a bonding pad (e.g. 1111). The bonding pads 1111, 1112, 1113, 1114, 1115 are formed on the planarized top surface 1116 of the oxide layer 1107.

Figure 12:
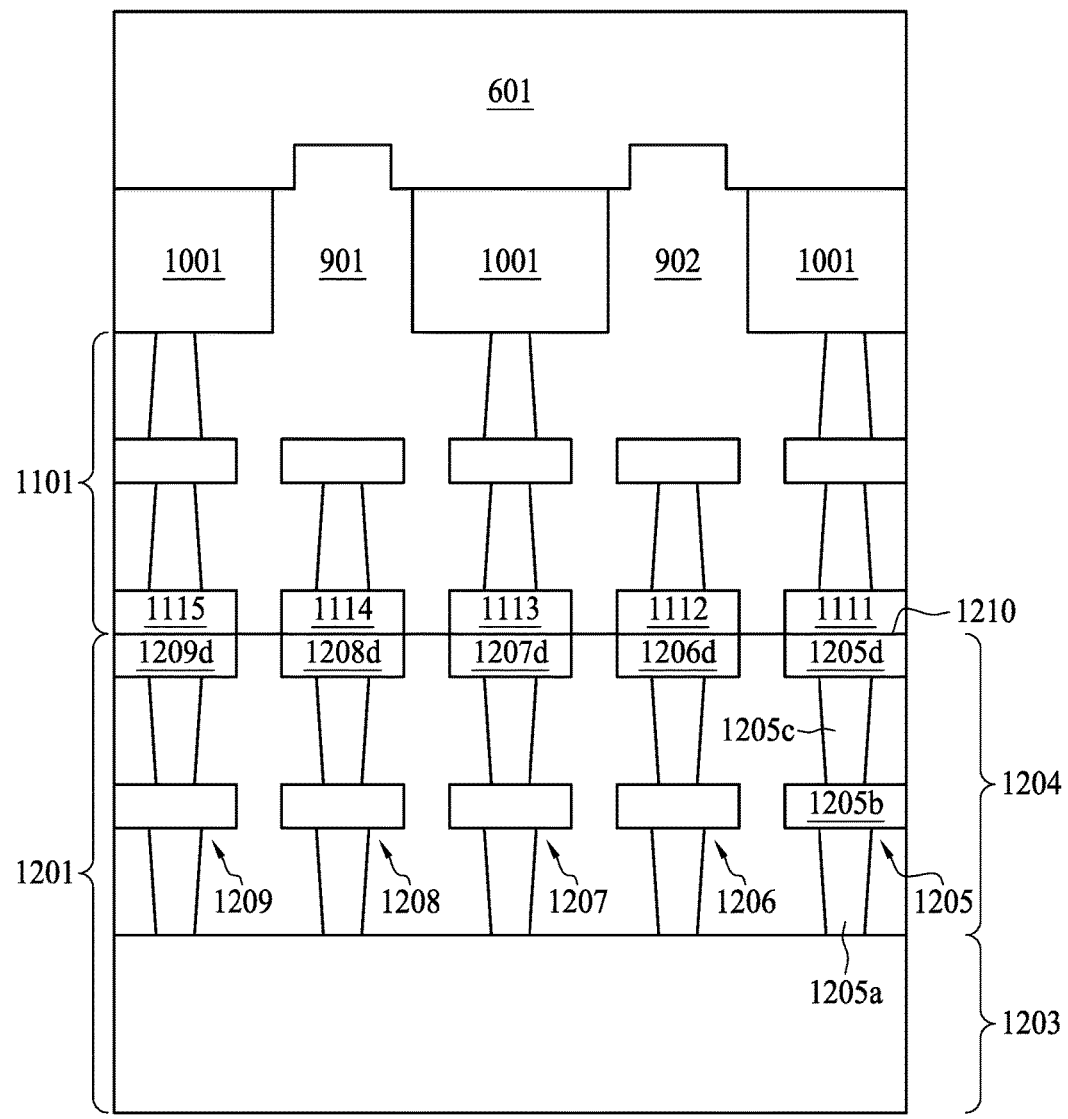

Referring to FIG. 12, in operation 507, a readout circuit wafer 1201 is bonded to the back end of line 1101. The readout circuit wafer 1201 comprises a silicon substrate 1203 and an interconnect layer 1204. The silicon substrate 1203 is configured to have a control circuit (e.g. 304 and 305). The interconnect layer 1204 is configured to have a plurality of interconnect structures 1205, 1206, 1207, 1208, 1209. Each interconnect structure comprises a first via (e.g. 1205a), a second via (e.g. 1205b), a metal line (e.g. 1205c), and a bonding pad (e.g. 1205d). The bonding pads 1205d, 1206d, 1207d, 1208d, 1209d are disposed on the surface 1210 of the readout circuit wafer 1201. The bonding pads 1205d, 1206d, 1207d, 1208d, 1209d are contacted with the bonding pads 1111, 1112, 1113, 1114, 1115 of the back end of line 1101 respectively.

Figure 13:
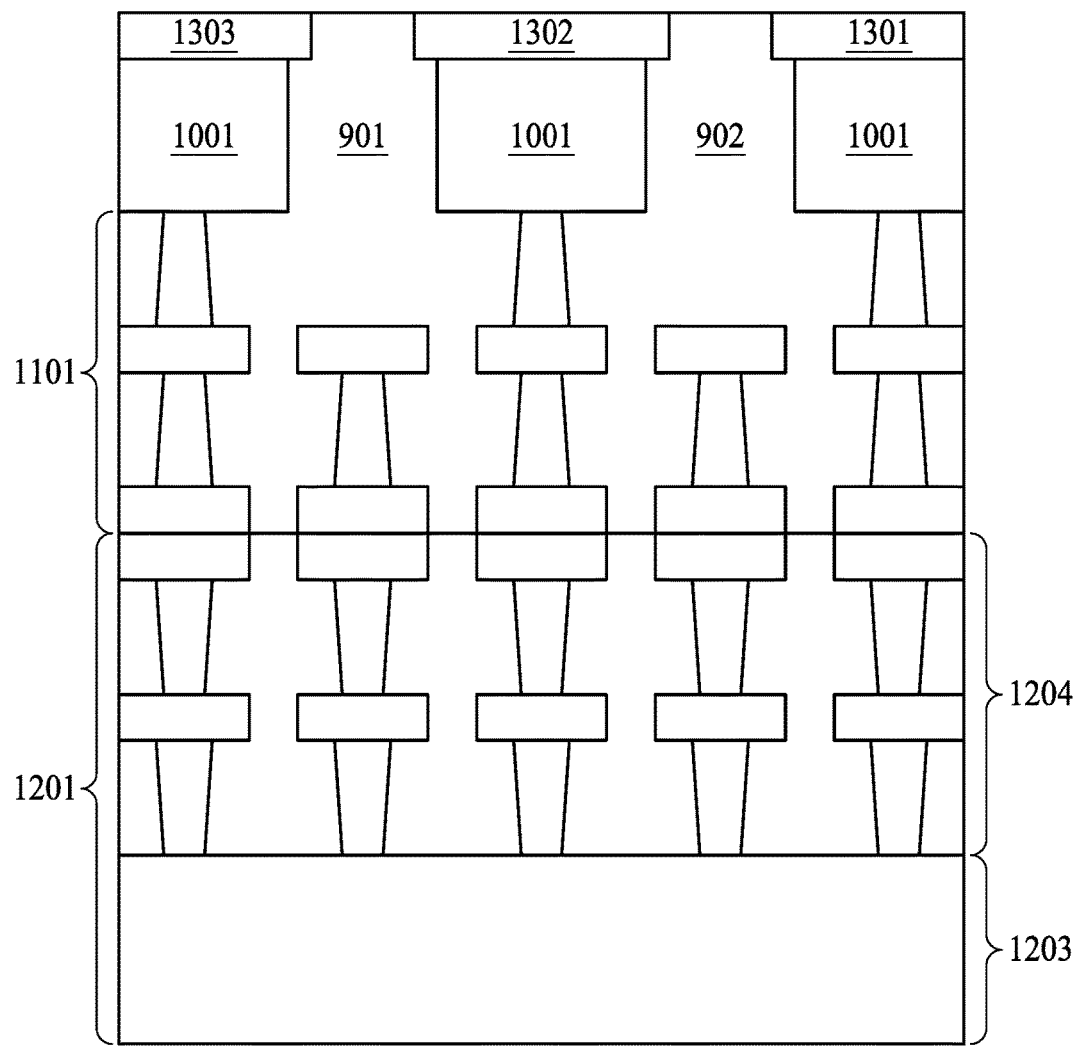

Referring to FIG. 13, in operation 508, the silicon substrate 601 is thinned down to expose the first oxide portion 901 and the second oxide portion 902. A plurality of silicon layers 1301, 1302, 1303 are left on the germanium selective epitaxials 1001.

Figure 14:
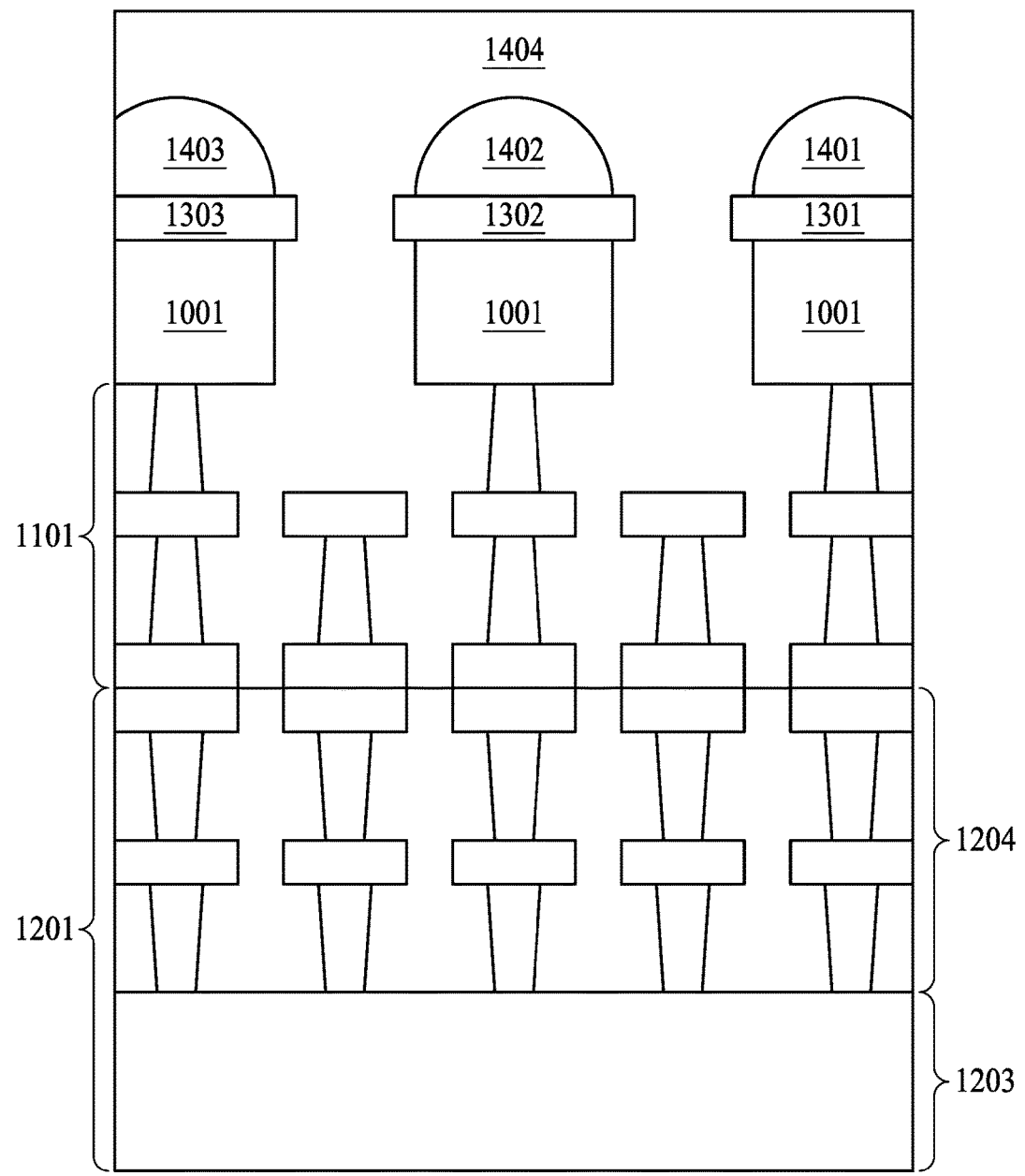

Referring to FIG. 14, in operation 509, a plurality of lenses 1401, 1402, 1403 are formed on the silicon layers 1301, 1302, 1303 respectively. The lenses 1401, 1402, 1403 may be microlenses. The material of the lenses 1401, 1402, 1403 may be composed of SiN. An oxide layer 1404 is formed by deposition and/or chemical mechanical polishing process to surround the lenses 1401, 1402, 1403.

Figure 15:
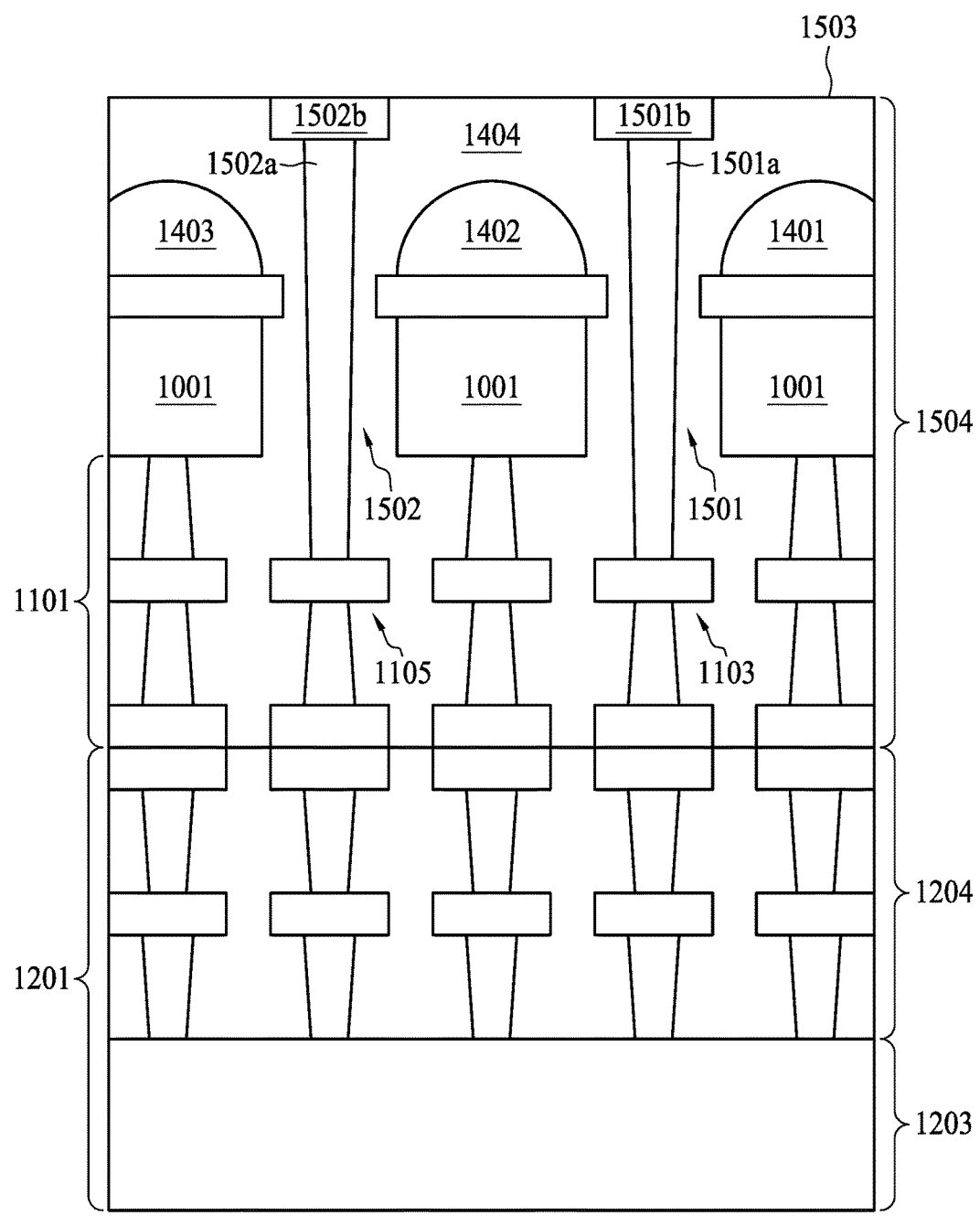

Referring to FIG. 15, in operation 510, a plurality of interconnect structures 1501, 1502 are formed on the interconnect structures 1103, 1105 respectively. Each interconnect structure comprises a via (e.g. 1501a, 1502a) and a bonding pad (e.g. 1501b, 1502b). The bonding pads 1501b, 1502b are formed on the surface 1503 of the oxide layer 1404. The vias 1501a, 1502a are connected to the metal lines of the interconnect structures 1103, 1105 respectively. According to some embodiments, the vias 1501a, 1502a are TSVs. Basically, in operation 510, an infrared ray sensing layer 1504 is formed.

Figure 16:
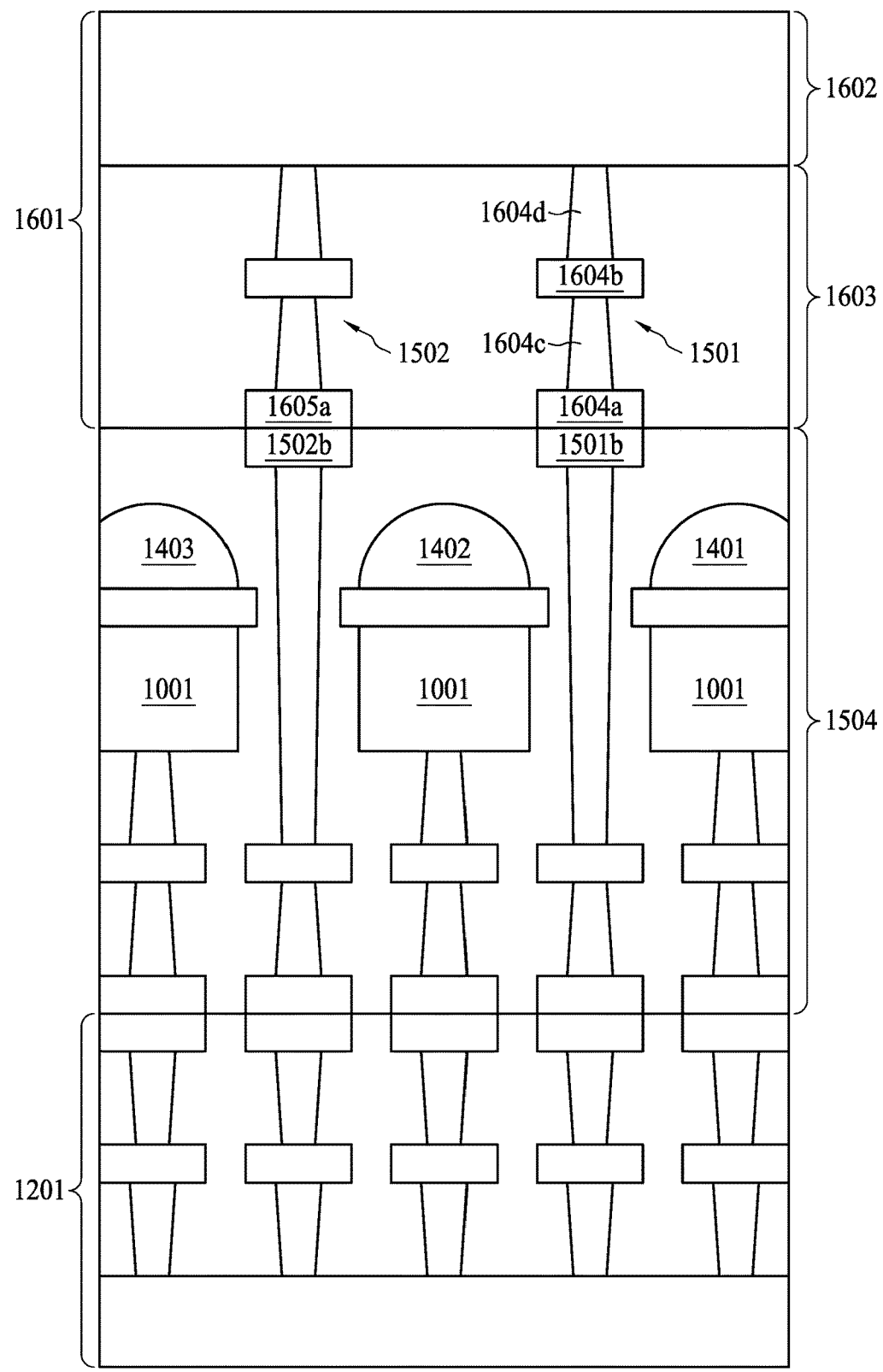

Referring to FIG. 16, in operation 511, a visible light sensing wafer 1601 is bonded to the infrared ray sensing wafer 1504. The visible light sensing wafer 1601 comprises a silicon substrate 1602 and an interconnect layer 1603. The silicon substrate 1602 is configured to have a plurality of photodiodes (e.g. 1045, 1046). The interconnect layer 1603 comprises a plurality of interconnect structures 1604, 1605. Each interconnect structure comprises a bonding pad (e.g. 1604a), a metal line (e.g. 1604b), and a plurality of vias (e.g. 1604c, 1604d). The bonding pads 1604a, 1605a are contacted to the bonding pads 1501b, 1502b of the infrared ray sensing wafer 1504 respectively.

Figure 17:
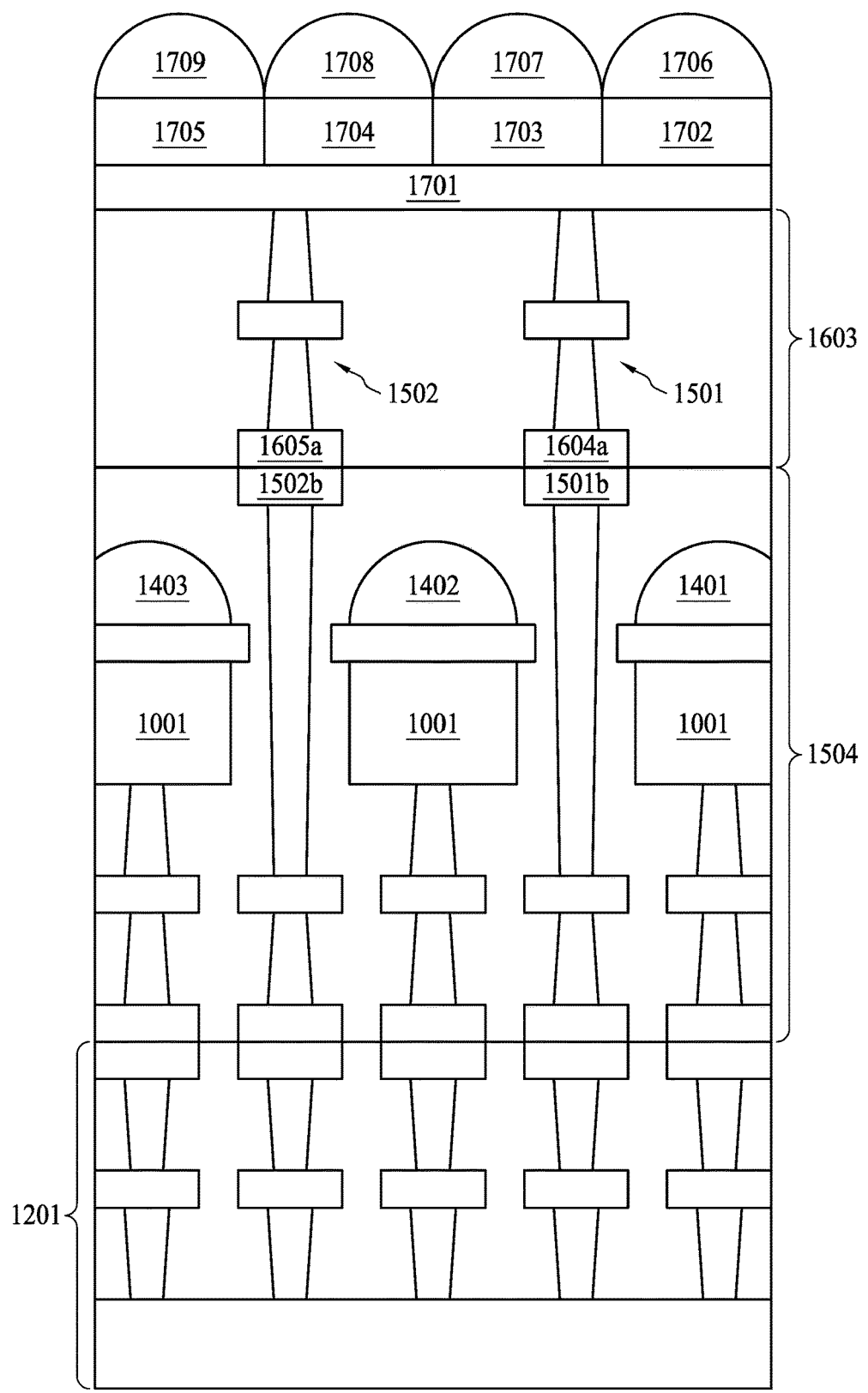

Referring to FIG. 17, in operation 512, the silicon layer 1602 is thinned down to be a thinned down silicon layer 1701. A plurality of color filters 1702, 1703, 1704, 1705 are formed and on the thinned down silicon layer 1701. A plurality of lenses 1706, 1707, 1708, 1709 are formed on the color filters 1702, 1703, 1704, 1705 respectively. The lenses 1706, 1707, 1708, 1709 may be microlenses.

In operation 512, a high sensitivity dual photo conversion image sensor (e.g. the semiconductor device 200) is fabricated. The visible light sensing wafer 1601 is arranged to detect the visible light of the incident light, and the infrared ray sensing layer 1504 is arranged to detect the infrared ray of the incident light.

It is noted that the operations 501-512 may be used to fabricated the semiconductor device 100 by slightly modifying the operation 1404. For example, to form the semiconductor device 100, the formation of the lenses 1401-1403 in the operation 1404 may be omitted.

Briefly, according to the present image sensor, the visible light sensing layer and the infrared ray sensing layer are disposed on the top two layer, and the circuitry layer is placed on the bottom layer of the image sensor, the infrared ray may not be blocked by the circuitry layer before entering the infrared ray sensing layer. The electrical signal generated by the visible light sensing layer is transmitted to the circuitry layer by the TSVs vertically disposed in the infrared ray sensing layer. Accordingly, the image sensor has relatively better performance of converting the infrared ray and visible light into electrical signals.

According to some embodiments, a semiconductor device is provided. The semiconductor device comprises a visible light sensing layer, an infrared ray sensing layer, and a circuitry layer. The visible light sensing layer has a first surface and a second surface opposite to the first surface. The infrared ray sensing layer has a first surface and a second surface opposite to the first surface, and the first surface of the visible light sensing layer attached to the second surface of the infrared ray sensing layer. The circuitry layer has a first surface and a second surface opposite to the first surface, and the first surface of the infrared ray sensing layer attached to the second surface of the circuitry layer.

According to some embodiments, a semiconductor device is provided. The semiconductor device comprises a first light sensing layer, a second light sensing layer, and a circuitry layer. The first light sensing layer is arranged to generate a first electrical signal according to incident light. The second light sensing layer is attached to the first light sensing layer for generating a second electrical signal according to the incident light. The circuitry layer is attached to the second light sensing layer for receiving the first electrical signal and the second electrical signal.

According to some embodiments, a method of forming a semiconductor device is provided. The method comprises: providing an infrared ray sensing layer having a first surface and a second surface opposite to the first surface; providing a circuitry layer having a first surface and a second surface opposite to the first surface; attaching the second surface of the circuitry layer to the first surface of the infrared ray sensing layer; providing a visible light sensing layer having a first surface and a second surface opposite to the first surface; and attaching the first surface of the visible light sensing layer to the second surface of the infrared ray sensing layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a visible light sensing layer, having a first surface and a second surface opposite to the first surface;
    an infrared ray sensing layer, having a first surface and a second surface opposite to the first surface, and the first surface of the visible light sensing layer attached to the second surface of the infrared ray sensing layer, and
    a circuitry layer, having a first surface and a second surface opposite to the first surface, and the first surface of the infrared ray sensing layer attached to the second surface of the circuitry layer;
    wherein the infrared ray sensing layer comprises:
    a first interconnect structure, disposed in the infrared ray sensing layer and vertically extended to the circuitry layer from the visible light sensing layer.

2. The semiconductor device of claim 1, further comprising:
    a lens, disposed on the second surface of the visible light sensing layer.

3. The semiconductor device of claim 1, wherein the infrared ray sensing layer further comprises:
    a first photodiode layer, having a first photodiode; and
    a second interconnect structure, electrically connected to the first photodiode.

4. The semiconductor device of claim 3, wherein the visible light sensing layer comprises:
    a second photodiode layer, having a second photodiode;
    a semiconductor layer, attached to the second photodiode layer, the semiconductor layer comprising a field-effect transistor electrically connected to the second photo diode; and
    a third via structure, electrically connected to the field-effect transistor and the first interconnect structure.

5. The semiconductor device of claim 3, wherein the circuitry layer comprises:
    a third interconnect structure, electrically connected to the first interconnect structure; and
    a fourth interconnect structure, electrically connected to the second interconnect structure.

6. The semiconductor device of claim 3, wherein the infrared ray sensing layer further comprises:
    a lens, disposed on the first photodiode layer.

7. A semiconductor device, comprising:
    a first light sensing layer, arranged to generate a first electrical signal according to incident light;
    a second light sensing layer, attached to the first light sensing layer, for generating a second electrical signal according to the incident light; and
    a circuitry layer, attached to the second light sensing layer, for receiving the first electrical signal and the second electrical signal;
    wherein the second light sensing comprising:
    a first interconnect structure, disposed in the second light sensing layer and vertically extended to the circuitry layer from the visible light sensing layer.

8. The semiconductor device of claim 7, wherein the interconnect structure transmits the first electrical signal to the circuitry layer.

9. The semiconductor device of claim 7, wherein the first light sensing layer is arranged to convert visible light of the incident light to the first electrical signal.

10. The semiconductor device of claim 7, wherein the second light sensing layer is arranged to convert infrared ray of the incident light to the second electrical signal.

11. The semiconductor device of claim 7, wherein the second light sensing layer is attached to a first surface of the first light sensing layer, the semiconductor device further comprises:
    a first lens, disposed on a second surface of the first light sensing layer, and the second surface of the first light sensing layer is opposite to the first surface of the first light sensing layer.

12. The semiconductor device of claim 11, wherein the first light sensing layer comprises:
    a first photodiode layer, having a first photodiode for converting the incident light into the first electrical signal;

a semiconductor layer, disposed on the first photodiode layer, the semiconductor layer having a field-effect transistor for generating an output signal according to the first electrical signal;

a first via, electrically connected to the field-effect transistor; and a first pad, electrically connected to the first via.

13. The semiconductor device of claim 12, wherein the second light sensing layer comprises:
   a second photodiode layer, having a second photodiode for converting the incident light into the second electrical signal;
   a second via, electrically connected to the second photodiode;
   a second pad, electrically connected to the second via;
   a third pad, electrically connected to the first pad;
   a fourth pad, disposed on the same horizontal level with the second pad; and
   a third via, having a first end electrically connected to the third pad and a second end electrically connected to the fourth pad.

14. The semiconductor device of claim 13, wherein the second light sensing layer further comprises:
   a second lens, disposed on the second photodiode.

15. The semiconductor device of claim 13, wherein the circuitry layer comprises:
   a fifth pad, electrically connected to the second pad;
   a sixth pad, electrically connected to the fourth pad;
   a fourth via, electrically connected to the fifth pad; and
   a fifth via, electrically connected to the sixth pad.

16. A method of forming a semiconductor device, the method comprising:
   providing an infrared ray sensing layer having a first surface and a second surface opposite to the first surface;
   providing a circuitry layer having a first surface and a second surface opposite to the first surface;
   attaching the second surface of the circuitry layer to the first surface of the infrared ray sensing layer;
   providing a visible light sensing layer having a first surface and a second surface opposite to the first surface; and
   attaching the first surface of the visible light sensing layer to the second surface of the infrared ray sensing layer,
   wherein providing the infrared ray sensing layer comprises:
      forming a first interconnect structure in the infrared ray sensing layer and vertically extending to the circuitry layer from the visible light sensing layer.

17. The method of claim 16, further comprising:
   forming a lens on the second surface of the visible light sensing layer.

18. The method of claim 16, wherein providing the infrared ray sensing layer further comprises:
   forming a first photodiode in a first photodiode layer; and
   forming a second interconnect structure, electrically connected to the first photodiode.

19. The method of claim 18, wherein providing the infrared ray sensing layer further comprises:
   forming a lens on the first photodiode layer.

20. The method of claim 18, wherein providing the visible light sensing layer comprises:
   forming a second photodiode layer having a second photodiode;
   forming a semiconductor layer comprising a field-effect transistor on the second photodiode layer; and
   forming a third interconnect structure to electrically connect to the field-effect transistor and the first interconnect structure.

* * * * *